United States Patent [19]
Toms

[11] Patent Number: 5,605,769
[45] Date of Patent: Feb. 25, 1997

[54] METHOD AND APPARATUS FOR SUPPLYING ELECTRICAL ENERGY TO BATTERY POWERED EQUIPMENT

[76] Inventor: Dennis J. Toms, 1750 30th St. #612, Boulder, Colo. 80301

[21] Appl. No.: 498,659

[22] Filed: Jul. 3, 1995

[51] Int. Cl.$^6$ .................................. H01L 31/045
[52] U.S. Cl. .................. 429/9; 136/245; 136/291; 320/2
[58] Field of Search .................. 136/245, 291; 429/9; 320/2

[56] References Cited

U.S. PATENT DOCUMENTS

| | | | |
|---|---|---|---|
| 4,421,943 | 12/1983 | Withjack | 136/246 |
| 4,452,234 | 6/1984 | Withjack | 126/627 |
| 4,481,265 | 11/1984 | Ezawa et al. | 429/9 |
| 4,539,516 | 9/1985 | Thompson | 320/48 |
| 4,574,160 | 3/1986 | Cull et al. | 136/245 |
| 4,630,791 | 12/1986 | Chapman | 244/173 |
| 4,636,579 | 1/1987 | Hanak et al. | 136/245 |
| 4,648,013 | 3/1987 | Curiel | 362/183 |
| 4,713,492 | 12/1987 | Hanak | 136/245 |
| 4,882,239 | 11/1989 | Grimmer et al. | 429/7 |
| 5,039,928 | 8/1991 | Nishi et al. | 320/2 |
| 5,076,634 | 12/1991 | Müller et al. | 296/97.5 |
| 5,221,891 | 6/1993 | Janda et al. | 323/350 |
| 5,225,003 | 7/1993 | Ming-Che | 136/206 |
| 5,258,076 | 11/1993 | Wecker | 136/245 |
| 5,364,710 | 11/1994 | Hikita | 429/9 |

FOREIGN PATENT DOCUMENTS

| | | | |
|---|---|---|---|
| 60-158565 | 8/1985 | Japan | 136/291 |

OTHER PUBLICATIONS

Taninecz, "Bellcore Debuts Solid Lithium–Ion Battery," Electronics, 28 Mar. 1994, p. 11.
Kishi et al., "A New Type of Ultralight Flexible A–Si Solar Cell," Japanese Journal of Applied Physics, Part 1, vol. 31, No. 1, pp. 12–17, Jan. 01, 1992.
Stevens, "Bellcore: Its Flexible Rechargeable Plastic Battery Could Revolutionize Design of Portable Consumer Electronics . . . ," Industry Week, vol. 243, No. 23, p. 38, Dec. 19, 1994.

*Primary Examiner*—Aaron Weisstuch

[57] ABSTRACT

The invention provides method and apparatus for supplying electrical energy to battery powered equipment of the type utilizing removable batteries. The method of the invention includes the steps of: placing within the battery compartment or battery holder of the equipment a rechargeable storage means for storing electrical energy to which is permanently attached and electrically connected a conversion means for converting light to electrical energy; establishing electrical connection between the rechargeable storage means and the equipment; utilizing the equipment in the normal manner until the rechargeable storage means is depleted of energy; removing the rechargeable storage means together with the attached conversion means from the battery compartment of the equipment; placing the rechargeable storage means together with the conversion means in such location and position that the conversion means is illuminated by light; conducting electrical charge from the conversion means to the rechargeable storage means; waiting until the rechargeable storage means is recharged; and reinserting the rechargeable storage means together with the conversion means in the battery compartment of the equipment. A preferred embodiment of the apparatus of the invention is characterized by a flexible member which contains the conversion means and which may be unfurled during charging so as to maximize the area of the conversion means exposed to incident light. After charging the flexible member is rolled up or wrapped around the circumference of the unit so that the entire unit will fit into the battery compartment or battery holder of the equipment to be powered.

23 Claims, 3 Drawing Sheets

METHOD AND APPARATUS FOR SUPPLYING ELECTRICAL ENERGY TO BATTERY POWERED EQUIPMENT

FIELD OF THE INVENTION

The present invention relates to supplying electrical energy to battery powered equipment of the type utilizing removable batteries and, more particularly, to the use of a rechargeable electrical energy source which may be recharged by placing it in bright light.

BACKGROUND OF THE INVENTION

Each year the number of battery powered electrical devices sold worldwide increases. Devices utilizing removable batteries include items of equipment such as flashlights, lanterns, radios, tape players and recorders, portable compact disc players, cameras, wall clocks, smoke detectors, hand and foot warmers, electronic games, and children's toys. In most cases, these devices are powered by throwaway primary batteries, presenting an ongoing expense to the user, and a disposal problem. Further, the widespread use of throwaway batteries wastes resources in terms of materials and energy required for their manufacture. Clearly, it would be of benefit to society if rechargeable batteries where more widely used.

Unfortunately, disadvantages inherent in the current practice discourage the widespread use of rechargeable batteries. Although charging units, both solar-powered and line-powered, are commercially available, a typical charging unit sells for the price of several sets of disposable batteries, making the cost of the initial investment a deterrent to many users. Moreover, the charging unit must be compatible with the batteries to be recharged. Since attempting to recharge a battery with an incompatible charging unit can pose a safety hazard, the user must be knowledgeable about battery-charger compatibilities. A substantial fraction of devices requiring removable batteries are children's toys. If small children are to recharge the batteries used in such toys, the issue of battery-charger compatibility and safety becomes extremely important. Also, since different types of batteries are frequently required in different electrical devices, the user may need to purchase several separate charging units of different types. Conventional chargers are limited to certain sizes and voltages of batteries, and to a certain number of batteries that can be recharged at one time. The user, therefore, must anticipate the types, sizes, voltages, and numbers of batteries to be used, when deciding which charging units to purchase. There is also the inconvenience to the user of keeping the appropriate charging unit ready to hand. This is particularly inconvenient when the device to be powered is highly portable, in which case the charging unit may be bulkier and heavier than the device to be powered.

SUMMARY OF THE INVENTION

The present invention overcomes the above cited disadvantages by providing a method of supplying electrical energy to battery powered equipment through the use of a self-contained unit which may be recharged by removing it from the equipment and placing it in bright light. Since the unit is self-contained the user is relieved of the need to purchase a separate charger. The problem of battery-charger compatibility is solved by having the charging means permanently attached to the storage means. As a result the user does not need to have knowledge of battery-charger compatibilities, thereby greatly enhancing safety as well as convenience. Moreover, the user can recharge any number of the self-contained units at one time, limited only by the available area illuminated by bright light. The present invention is also highly portable. When used in portable equipment, the self-contained units will ordinarily be transported from place to place while installed inside the equipment; thus the recharging means will be ready to hand. Portability is also enhanced by the fact that no electrical power source is required for recharging, permitting recharging in remote areas. Since the self-contained units can be recharged without plugging into an electric outlet, they can be safely recharged by children for use in battery powered toys. In the latter application the present invention can serve an educational function, teaching children about energy conversion, and promoting environmental awareness.

Accordingly, the present invention provides method and apparatus for supplying electrical energy to battery powered equipment of the type utilizing removable batteries. The method of the present invention includes the operative steps of: (a) placing within the battery compartment or battery holder of the equipment to be powered a rechargeable storage means for storing electrical energy to which is permanently attached and electrically connected a conversion means for converting light to electrical energy; (b) establishing electrical connection between the rechargeable storage means and the equipment to be powered; (c) using the equipment in the normal manner until the rechargeable storage means is depleted of electrical energy; (d) removing the rechargeable storage means along with the attached conversion means from the battery compartment or battery holder of the equipment; (e) placing the rechargeable storage means along with the conversion means in such location and position that the conversion means is illuminated by bright light; (f) conducting electrical charge from the conversion means to the rechargeable storage means; (g) waiting until the rechargeable storage means is recharged; and (g) reinserting the rechargeable storage means along with the attached conversion means in the battery compartment or battery holder of the equipment to be powered. A preferred embodiment of the invention is characterized by a flexible member which contains the conversion means and which may be unfurled during charging so as to maximize the area of the conversion means exposed to light, thereby increasing the charging rate and decreasing the time required to attain a full charge, and further, permitting charging under diminished light. After charging the flexible member is rolled up or wrapped around the circumference of the unit so that the entire unit will fit into the battery compartment or battery holder of the equipment to be powered.

DETAILED DESCRIPTION OF THE PREFERRED EMBODIMENTS

Figure 1:
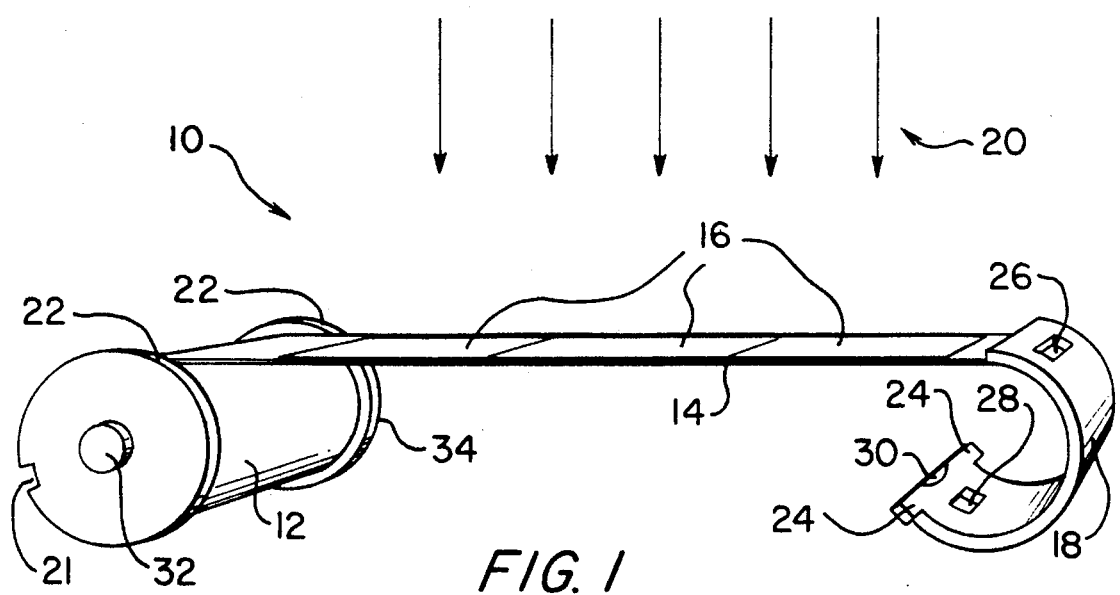
FIG. 1 is a perspective view of a preferred embodiment of apparatus of the present invention, shown in position for charging.

Referring now to the drawings, and more particularly to FIG. 1, there is shown a preferred embodiment of the apparatus of the present invention, generally designated 10, for supplying electrical energy to equipment requiring electrical power and having a compartment or a holder for a removable battery. The apparatus 10 principally includes a rechargeable storage means 12 for storing electrical energy, to which is attached a flexible member 14, a portion of which contains a conversion means 16 for converting light to electrical energy. Attached to distal end of the flexible member 14 is a semi-rigid curved member 18 which serves several functions to be described below. The apparatus in FIG. 1 is shown removed from the battery compartment or battery holder of the equipment requiring electrical power, with the flexible member 14 unfurled so as expose the conversion means 16 to incident light 20, represented by arrows. The incident light 20 may be direct or indirect sunlight, or light from an artificial source.

Figure 2:
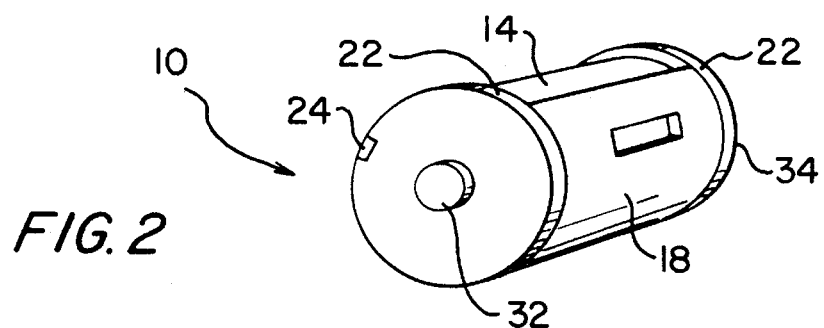
FIG. 2 is a perspective view of the preferred embodiment of FIG. 1, shown in position for inserting in electrical equipment.

Now referring to FIG. 2, the apparatus 10 is shown with the flexible member 14 furled so that the apparatus may be placed within a battery compartment or battery holder of the equipment to be powered. The curved member 18 snaps over furled flexible member 14 and between rims 22. Tension in the curved member keeps it firmly in place over the furled flexible member. Projections 24 of the curved member 18 fit into notches 21 in the rims 22, preventing the curved member from rotating. Thus the curved member 18 serves as a means for securing the flexible member 14 in furled position. As the curved member 18 partially covers the flexible member 14, the curved member 18 also serves as a means for coveting and protecting the flexible member 14 when furled. When the flexible member is furled as shown in FIG. 2 the outer dimensions of the apparatus may be approximately the same as the outer dimensions of a standard size cell or battery, such as D-size, C-size, B-size, A-size, AA-size etc. When the apparatus 10 is inserted in the battery compartment or battery holder of the equipment to be powered, electrical contacts 32 and 34 come into contact with conventional electrical contacts within the battery compartment or battery holder. The electrical contact 34 may comprise the entire end surface of the rechargeable storage means 12, in the manner of a conventional cell.

In the preferred embodiment shown in FIGS. 1 and 2, the rechargeable storage means 12 may be a rechargeable storage cell or battery of any of several types, including, but not restricted to: alkaline, nickel-metal-hydride, lithium-ion, aluminum-air, nickel-cadmium, lead-acid (sealed), or super-capacitor. The rechargeable storage cell constituting the rechargeable storage means 12 may be of conventional construction with an outer diameter slightly reduced from that of a standard sized cell.

The conversion means 16 may comprise thin flexible photovoltaic cells of the amorphous silicon type. One method of fabricating such cells, for example, is described in Kishi et al., *Japanese Journal of Applied Physics*, v.31, pt.1, n.1, p.12 (January 1992). Such cells may be fabricated on a polyimide substrate and have a thickness, for example, of 20 micrometers. The flexible member 14 may be formed by laminating the amorphous silicon cells between two sheets of transparent flexible plastic so as to encapsulate and protect the cells. The thickness of the flexible member may be, for example, 0.12 millimeter. By way of example, a flexible solar cell array of similar thickness and bendable to a 5 millimeter radius is described in Kishi et al.

The curved member 18 may be made of a semi-rigid plastic, such as high-density polyethylene, having sufficient elasticity so that it will return to its original shape after being flexed. The wall thickness of the curved member may be, for example, 1.0 millimeter. The inner radius of the curved member may increase by, for example, about 7 percent in going from the position shown in FIG. 1 to the position shown in FIG. 2. The curved member 18 may cover, for example, about 240 degrees of the circumference of furled flexible member 14 when in the position shown in FIG. 2. A first hole 26 and a second hole 28 in the curved member 18 (see FIG. 1) are aids to suspending the apparatus in a vertical position, as from a hook or a nail. An indented surface 30 provides space for inserting a thumbnail or fingernail to aid in releasing the curved member 18 prior to unfurling the flexible member 14.

Figure 3:
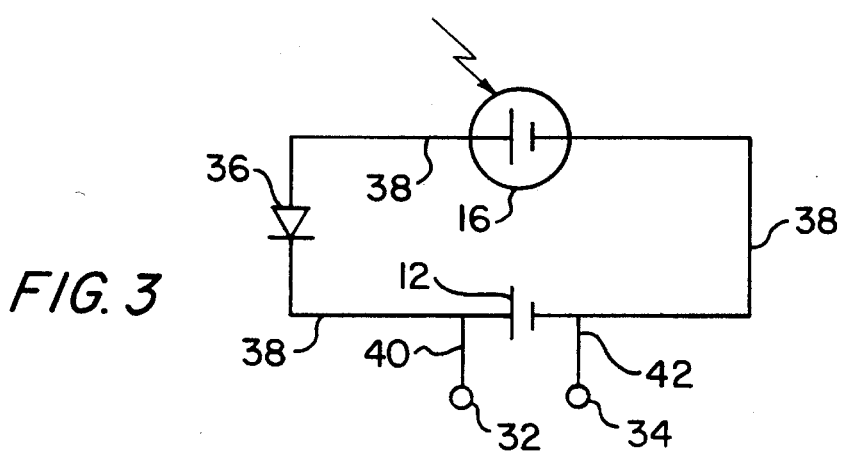
FIG. 3 is an electrical diagram of the apparatus of FIGS. 1 and 2.

Referring now to FIG. 3, an electrical diagram of the preferred embodiment of FIGS. 1 and 2 is shown in schematic form. The first electrical contact 32 is electrically connected to the positive electrode of the rechargeable storage means 12 by a conductive path 40. The second electrical contact 34 is electrically connected to the negative electrode of the rechargeable storage means 12 by a conductive path 42. Thus the electrical contacts 32 and 34, and the conductive paths 40 and 42, together constitute a connection means for establishing electrical connection between the rechargeable storage means 12 and the equipment to be powered.

Still referring to FIG. 3, the conversion means 16 is electrically connected in series with the rechargeable storage means 12 and blocking diode 36 by the conductive paths 38. Thus the conductive paths 38 and blocking diode 36 serve as a means for conducting electrical charge from the conversion means 16 to the rechargeable storage means 12 during charging. The purpose of the blocking diode is to prevent the flow of reverse current through the conversion means when the conversion means is in diminished light or in darkness (as when installed in a battery compartment). The blocking diode may be contained within the flexible member, or it may be contained in one of the rims.

During charging the voltage output of the conversion means must be sufficiently high to match the sum of the voltage of the rechargeable storage means and the forward dropping voltage of the blocking diode. A sufficiently high voltage may be attained by including within the conversion means an appropriate number of photovoltaic cells connected in series. The areas of the photovoltaic cells may be predetermined so as to produce the desired charging current under the range of illumination expected. In general, the areas of the photovoltaic cells may be such that the current handling capability of the rechargeable storage means is not exceeded under the maximum level of illumination expected, and the voltages of the photovoltaic cells and the blocking diode may be such that the charging current tapers off as the voltage of the rechargeable storage means rises when approaching full charge. A variation of the preferred embodiment may include additional circuitry of conventional configuration (not shown) for regulating and/or limiting the charging current.

Figure 4:
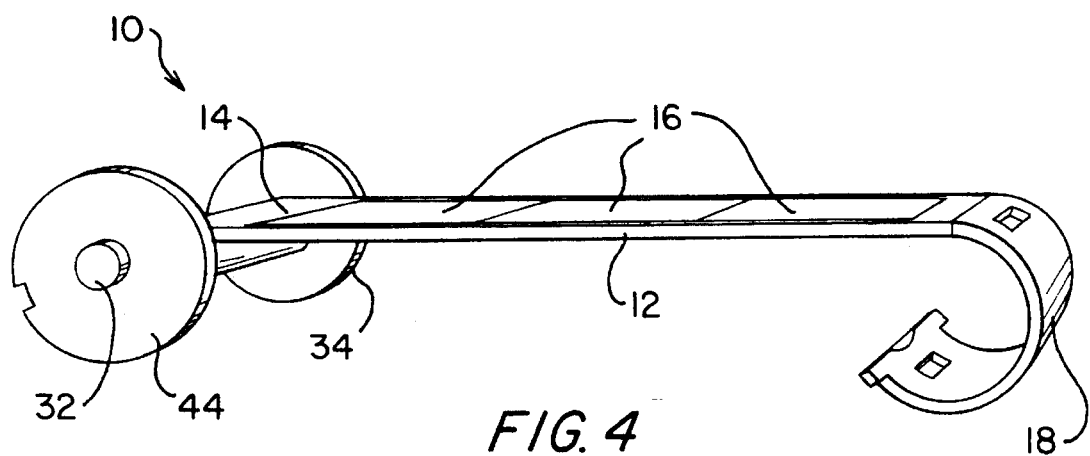
FIG. 4 is a perspective view of a further preferred embodiment of the apparatus of the present invention.

FIG. 4 shows a further preferred embodiment of the present invention. In FIG. 4 the basic elements are provided with the same reference numerals as in FIGS. 1 and 2. Apparatus 10 basically includes a spool-like structure 44 to which is attached flexible member 14, shown in unfurled position in FIG. 4. The flexible member 14 in this embodiment is a lamination combining the conversion means 16 with the rechargeable storage means 12. The rechargeable storage means 12 in this embodiment may be a flexible storage cell, or a battery of storage cells, such as the flexible plastic cell or battery reported by Stevens, *Industry Week*, v.243, n.23, p.38 (19 Dec. 1994). The spool-like structure 44 has electrical contacts entirely similar in function to those of the first preferred embodiment of FIG. 2. The spool-like structure 44 may be made predominantly of a rigid plastic with metallic pathways for electrical conduction. The essential difference between the embodiment of FIG. 4 and the embodiment of FIG. 1 is in the nature of the flexible member 14 which combines the functions of light conversion and energy storage in a single member. Otherwise, the two embodiments are basically the same in function and operation.

A variation of the embodiment shown in FIG. 4 may combine the functions of the conversion means 16 and the rechargeable storage means 12 in one or more flexible photogalvanic storage cells. In a photogalvanic storage cell the incident light is absorbed directly in the cell solution causing a chemical reaction producing long-lived species, thereby storing energy in chemical form. The chemical reaction is later reversed, generating electrical current, when electrical connection through an external circuit is established. To fabricate a flexible photogalvanic storage cell, the photoreactive solution of the photogalvanic cell may be entrapped within the molecular structure of a flexible polymer, in a manner similar to the storage cells reported by Stevens. The flexible polymer containing the entrapped solution may be sandwiched between two flexible conducting layers, one being transparent so as to admit light to the cell solution.

Each of the embodiments described above has certain advantages over the other. The preferred embodiment of FIG. 1 has the advantage of utilizing mature energy storage technology and therefore can be readily fabricated in forms having various shapes, sizes, voltages, discharge characteristics, etc. Thus this embodiment is applicable to a wide variety of battery powered equipment currently in use. Also, having the major part of the weight of the unit concentrated in the rechargeable storage means has certain advantages, which will become apparent in the discussion below on the method of using. The embodiment of FIG. 4, and its variations, has the advantage of allowing both the rechargeable storage means and the conversion means to be fabricated using continuous thin-film production techniques. Thus this embodiment is conducive to high volume production, which may result in very low cost units.

METHOD OF USING

When the apparatus 10 is in the configuration shown in FIG. 2, with the flexible member 14 furled and secured in place by the curved member 18, the apparatus may be installed in the battery compartment or battery holder of the equipment to be powered in the same manner as a conventional battery, with the electrical contacts 32 and 34 establishing electrical connection with the equipment to be powered by coming into contact with conventional electrical contacts in the battery compartment or battery holder. The equipment may then be utilized in the normal manner until the electrical energy stored within the rechargeable storage means is fully or partially depleted. When in a discharged state, the apparatus 10 may be removed from the electrical equipment and recharged by releasing the curved member 18, unfurling the flexible member 14, as shown in FIG. 1, and placing the apparatus in a location and position such that light impinges on the conversion means 16.

Referring to FIG. 3, while light is impinging on the conversion means 16, electrical charge is conducted from the conversion means 16 to the rechargeable storage means 12 through the conductive paths 38 and blocking diode 36, thereby charging the rechargeable storage means 12. After a suitable period of time has elapsed and the rechargeable storage means is judged to be sufficiently charged, the flexible member may again be furled and the apparatus may be reinstalled in the electrical equipment.

Referring to FIGS. 1 and 2, to unfurl the flexible member 14, the curved member 18 may be released by lifting its edge until the projections 24 are clear of the notches 21 in the rims 22 and rotating the curved member 18 about its opposite edge so that the curved member 18 slips free of the cylindrical shape formed by furled flexible member 14. The flexible member may then be unfurled to its full extent.

Figures 5A, 5B:
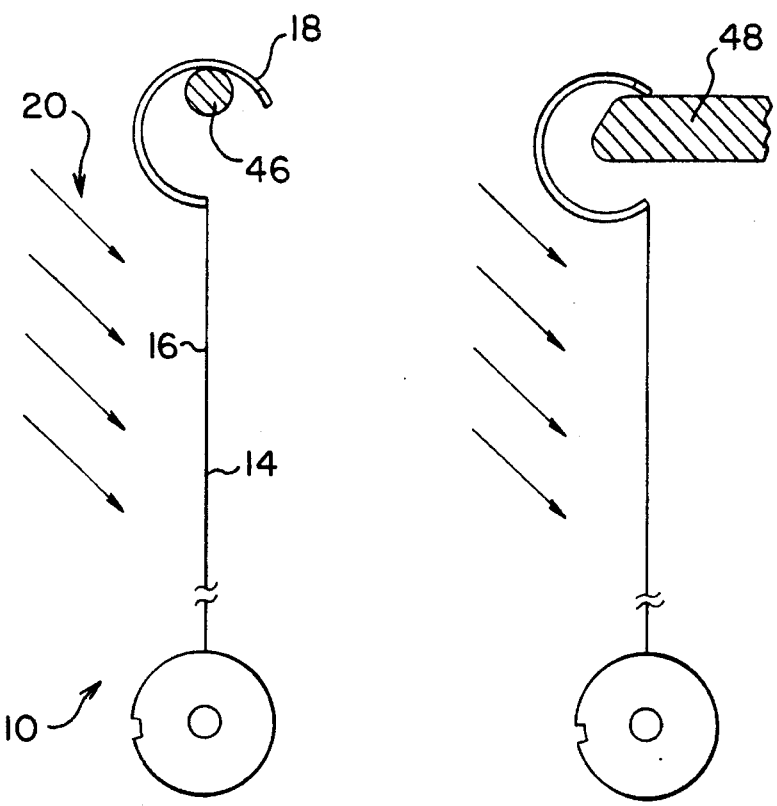
FIGS. 5A to 5D are schematic views showing several methods of suspending the apparatus of the present invention in a predominantly vertical position for charging.
Figures 5C, 5D:
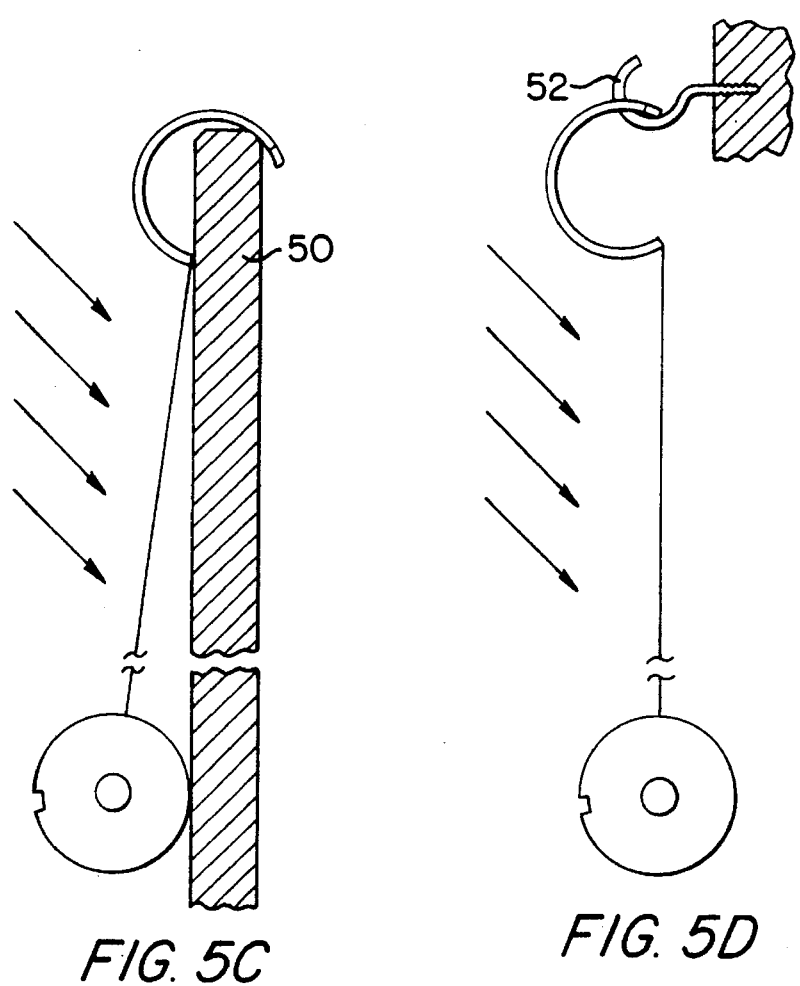

Referring to FIG. 5, there are illustrated several methods of suspending the apparatus in position for charging. With the flexible member 14 unfurled, the curved member 18 serves as a means for suspending the apparatus 10 in a predominantly vertical position. The curved member may be hooked directly over a fixed object in the environment, as shown in FIG. 5A, FIG. 5B, and FIG. 5C. Or, the apparatus may be suspended utilizing the holes in the curved member, as shown in FIG. 5D. By suspending the apparatus from the end of the flexible member in a predominantly vertical position, the weight of the rechargeable storage means keeps the flexible member 14 taut and the conversion means 16 facing in the direction of the incident light 20, and further, when charging outdoors, prevents the apparatus from blowing about excessively in the wind.

Referring to FIG. 5A, an elongated object 46 may be a natural or man-made object in the environment, such as, a tree branch, a rod, a bar, a clothesline, or barbed wire in a fence. Referring to FIG. 5B, a horizontal edge 48 may be, for example, a table edge, a shelf, or a window sill. Referring to FIG. 5C, a vertical edge 50 may be, for example, the top edge of a fence, a chair back, or a board propped against an exterior wall. Referring to FIG. 5D, hanger 52 may be, for example, a hook, a brad, a nail, or a peg.

Indoors, the apparatus may be suspended for charging near the inner surface of an exterior-facing window by fastening a hanger, which may be of the type having a suction cup, or of the type having an adhesive backing, to the inner surface of the window pane, and placing the first hole 26 (shown in FIG. 1) over the hook portion of the hanger. Alternatively, the apparatus may be suspended near the window by hooking the curved member over a curtain rod, in the manner of suspension shown in FIG. 5A. It is likely that the method of suspending the apparatus near the inner surface of a window will be the charging mode preferred by many users, since spare units can be maintained in a state of full charge by leaving them suspended in the window indefinitely until needed.

For charging under artificial lighting, the apparatus may, for example, be suspended near the light bulb of a lamp having a lampshade by hooking the curved member over the top edge of the lampshade with the flexible member interior to the lampshade and the conversion means facing towards the bulb.

Figure 6:
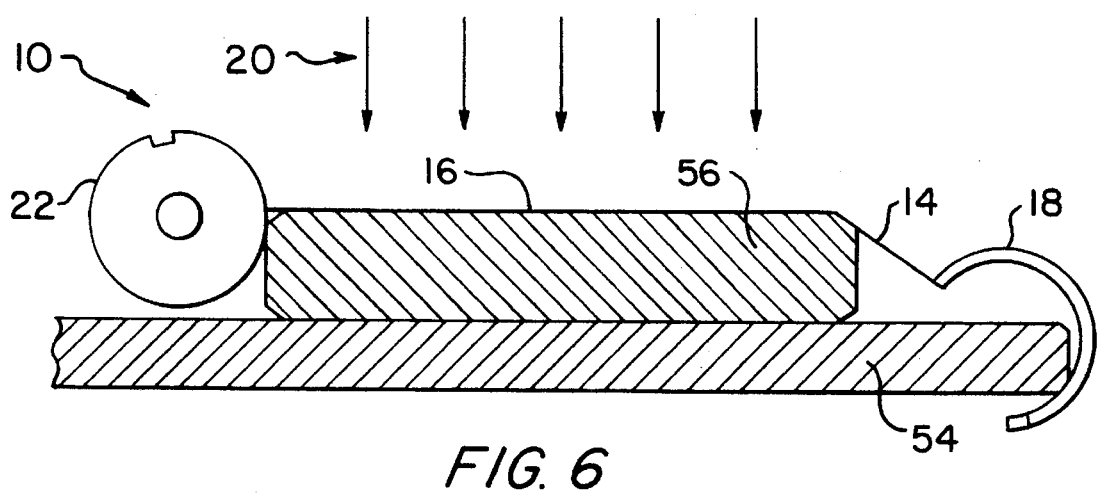
FIG. 6 is a schematic view showing a method of holding the apparatus of the present invention in a horizontal position during charging.

A method of holding the apparatus of the present invention in a horizontal position for charging is shown in FIG. 6. The curved member 18 is hooked over the edge of a supporting object 54 in the environment (such as a table top) and a supporting block 56 is placed under the flexible member 14 and positioned so that the flexible member is held taut, with the conversion means 16 exposed to the incident light 20. Ideally, the thickness of the supporting block 56 should be slightly greater than the radius of the rims 22, allowing the supporting block to be positioned so that the weight of the rechargeable storage means pulls the flexible member taut, with the rims 22 suspended slightly above the surface of the supporting object 54. In this manner the apparatus 10 can be securely held for charging outdoors, even in strong winds. The supporting block 56 may be made of wood or any convenient material, or, it may be an appropriately shaped object found in the environment, such as a book, a shallow box, etc. The supporting block 56 may be large enough to simultaneously hold several units for charging.

RAMIFICATIONS AND SCOPE

It is thought that the method and apparatus for supplying electrical energy to battery powered equipment and many of its attendant advantages will be understood from the foregoing description and it will be apparent that various changes may be made in the form, construction, and arrangement of the parts thereof without departing from the spirit and scope of the invention or sacrificing all of its material advantages. For example, the means for securing the flexible member in furled position, and the means for covering and protecting the flexible member when furled, may involve the use of a cylindrical sleeve which can be slipped over the unit before inserting the unit in the equipment to be powered. Or, the flexible member and the rechargeable storage means may be contained within a cassette or cartridge, in manner similar to that of a photographic film cartridge. The flexible member would then be unfurled by pulling one end out through a slot in the side of the cartridge. The flexible member could also be secured in furled position by an elastic band looped around the circumference of the unit. The elastic band could be permanently attached to the end of the flexible member and further serve as the means for suspending the apparatus in a predominantly vertical position for charging. Although it is believed that such alternative embodiments would not provide all of the attendant advantages of the preferred embodiments described above, it is intended that they be understood to fall within the scope of the present invention.

Additional embodiments may also differ in size and shape from the preferred embodiments previously described. For example, instead of having the size, shape, and voltage of a single standard cell, embodiments with "double-long" or "double-wide" configurations are possible. A "double-wide" configuration for lithium batteries, for example, is commonly used in cameras. The present invention may be readily adapted to noncylindrical shapes, such as oblong or rectangular shapes with rounded edges. Examples of such noncylindrical shapes include 6 volt lantern batteries, 9 volt (9V-size) batteries, and battery packs designed for use in camcorders and portable computers.

Further, the conversion means may be distributed over both surfaces of the flexible member, allowing charging in ambient light without regard to orientation. Still another embodiment could include an indicator for indicating the state of charge of the unit.

It is therefore intended that the foregoing detailed description be regarded as illustrative rather than limiting, and that the scope of the invention be determined by the appended claims and their legal equivalents, rather than by the examples given.

I claim:

1. A method of supplying electrical energy to an item of equipment requiring electrical power and having a compartment for at least one removable battery, comprising the steps of:

(a) inserting in said compartment a rechargeable storage means for storing electrical energy together with a flexible member wrapped around said rechargeable storage means and containing a conversion means for converting light to electrical energy, said flexible member compactible by furling and extensible by unfurling;

(b) establishing electrical connection between said rechargeable storage means and said item of equipment;

(c) utilizing said item of equipment until said rechargeable storage means is at least partially discharged;

(d) removing said rechargeable storage means together with said flexible member from said compartment;

(e) unfurling said flexible member so as to form a substantially flat surface;

(f) placing said rechargeable storage means together with said flexible member in such location and position that light impinges on said conversion means when said location is illuminated;

(g) conducting electrical charge from said conversion means to said rechargeable storage means as light impinges on said conversion means;

(h) waiting a period of time until said rechargeable storage means is at least partially recharged as a result of light impinging on said conversion means;

(i) compacting said flexible member by furling same around said rechargeable storage means so that said rechargeable storage means together with said flexible member may be manipulated to fit within said compartment;

(j) reinserting said rechargeable storage means together with said flexible member in said compartment.

2. The method as recited in claim 1 wherein said step of placing said rechargeable storage means together with said flexible member in such location and position that light impinges on said conversion means includes positioning said flexible member in a substantially vertical position by hooking a curved member attached to one end of said flexible member over a fixed object of the environment.

3. The method as recited in claim 1 wherein said step of placing said rechargeable storage means together with said flexible member in such location and position that light impinges on said conversion means includes positioning said flexible member in a substantially horizontal position by hooking a curved member attached to one end of said flexible member over a fixed object of the environment and placing and positioning a supporting block under said flexible member so that said flexible member is held taut in unfurled position.

4. The method as recited in claim 1 wherein said step of compacting said flexible member by furling so that said rechargeable storage means together with said flexible member may be manipulated to fit within said compartment includes securing said flexible member in furled position by fitting a curved member over said flexible member, said curved member attached to the distal end of said flexible member and extending at least halfway around the circumference of said flexible member when furled.

5. A method of supplying electrical energy from within a confined volume to an item of equipment requiting electrical power, comprising the steps of:

(a) inserting in said confined volume a flexible member, said flexible member containing a rechargeable storage means for storing electrical energy and a conversion means for converting light to electrical energy, said flexible member being compactible by furling and extensible by unfurling;

(b) establishing electrical connection between said rechargeable storage means and said item of equipment;

(c) utilizing said item of equipment until said rechargeable storage means is at least partially discharged;

(d) removing said flexible member from said confined volume;

(e) unfurling said flexible member so as to form a substantially flat surface;

(f) placing said flexible member in such location and position that light impinges on said conversion means when said location is illuminated;

(g) conducting electrical charge from said conversion means to said rechargeable storage means as light impinges on said conversion means;

(h) waiting a period of time until said rechargeable storage means is at least partially recharged as a result of light impinging on said conversion means;

(i) furling said flexible member so that said flexible member becomes sufficiently compact to be reinserted in said confined volume.

6. An energy source for supplying electrical energy to an item of equipment requiring electrical power and having a compartment for at least one removable battery, said compartment having therein electrical contacts for establishing electrical connection with said item of equipment, comprising:

(a) a rechargeable storage means for storing electrical energy;

(b) a conversion means for converting light to electrical energy;

(c) a flexible member, at least a portion of said flexible member containing said conversion means;

(d) a conducting means for conducting electrical charge from said conversion means to said rechargeable storage means;

(e) a connecting means for establishing electrical connection between said rechargeable storage means and said electrical contacts;

(e) said rechargeable storage means, said conversion means, said flexible member, said conducting means, and said connecting means forming a unit such that said unit can be manipulated to fit within said compartment of said item of equipment;

(f) said flexible member being compactible by furling and extensible by unfurling, said flexible member when fully unfurled forming a substantially flat surface having its longest dimension greater than at least one lateral dimension of said compartment.

7. The energy source as recited in claim 6 wherein said unit further includes a curved member attached to the distal end of said flexible member, said curved member being of such shape and having such rigidity that said curved member can support the weight of said unit when said flexible member is unfurled and said curved member is hooked over a fixed object in the environment, said curved member further shaped and attached to said flexible member in such orientation that said curved member at least partially covers said flexible member when said flexible member is in its furled position.

8. The energy source as recited in claim 6 wherein said unit further includes a securing means for securing said flexible member in its furled position, said securing means attached to the distal end of said flexible member and extending at least halfway around the circumference of said flexible member when said flexible member is secured in its furled position.

9. The energy source as recited in claim 8 wherein said securing means comprises a hollow partial cylinder having a lesser inside diameter than the outside diameter of said flexible member when furled, said hollow partial cylinder having sufficient elasticity so that said hollow partial cylinder can be fitted over said flexible member when furled without suffering permanent deformation.

10. The energy source as recited in claim 8 wherein said securing means comprises a curved member shaped so as to at least partially cover said flexible member when said flexible member is secured in its furled position.

11. The energy source as recited in claim 10 wherein said curved member has an indented surface interior to one end portion thereof, whereby said indented surface may serve as an aid to releasing said securing means prior to unfurling said flexible member.

12. The energy source as recited in claim 6 wherein said unit further includes: rims disposed so that said flexible member can be furled between said rims; and, a curved member attached to the distal end of said flexible member, said curved member of such shape so as to fit substantially between said rims when said flexible member is in its furled position.

13. The energy source as recited in claim 12 wherein said unit further includes notches in said rims, and wherein said curved member has projections engaging said notches when said flexible member is in its furled position.

14. The energy source as recited in claim 6 wherein said rechargeable storage means is contained within a portion of said flexible member.

15. The energy source as recited in claim 14 wherein said conversion means and said rechargeable storage means together constitute at least one photogalvanic cell.

16. The energy source as in claim 14 wherein said rechargeable storage means comprises at least one flexible storage cell of the lithium-ion type.

17. The energy source as recited in claim 14 wherein said unit further includes a spool-like structure having rims; said flexible member attached by one end to said spool-like structure and furlable between said rims.

18. The energy source as recited in claim 6 wherein said conversion means comprises at least one photovoltaic cell.

19. The energy source as recited in claim 6 wherein said unit is such that said energy source with said flexible member secured in its furled position has substantially the same dimensions as a cell of standard size, whereby said energy source may substitute for a conventional cell of a standard size.

20. The energy source as recited in claim 19 wherein said standard size is selected from the group consisting of D-size, C-size, B-size, A-size, and AA-size.

21. The method as recited in claim 5 wherein said step of placing said flexible member in such location and position that light impinges on said conversion means includes positioning said flexible member in a substantially vertical position by hooking a curved member attached to one end of said flexible member over a fixed object of the environment.

22. The method as recited in claim 5 wherein said step of placing said flexible member in such location and position that light impinges on said conversion means includes positioning said flexible member in a substantially horizontal position by hooking a curved member attached to one end of said flexible member over a fixed object of the environment and placing and positioning a supporting block under said flexible member so that said flexible member is held taut in unfurled position.

23. The method as recited in claim 5 wherein said step of furling said flexible member so that said flexible member becomes sufficiently compact to be reinserted in said confined volume includes securing said flexible member in furled position by fitting a curved member over said flexible member, said curved member attached to the distal end of said flexible member and extending at least halfway around the circumference of said flexible member when furled.

* * * * *

UNITED STATES PATENT AND TRADEMARK OFFICE
CERTIFICATE OF CORRECTION

PATENT NO. : 5,605,769
DATED : Feb. 25, 1997
INVENTOR(S) : Dennis J. Toms

It is certified that error appears in the above-indentified patent and that said Letters Patent is hereby corrected as shown below:

Col. 3, line 34, change 'coveting' to --covering--.

Col. 8, line 66, change 'requiting' to --requiring--.

Signed and Sealed this

Thirteenth Day of May, 1997

Attest:

BRUCE LEHMAN

*Attesting Officer*　　　*Commissioner of Patents and Trademarks*